US006777742B2

(12) United States Patent
Jong et al.

(10) Patent No.: US 6,777,742 B2
(45) Date of Patent: Aug. 17, 2004

(54) HEXAGONAL GATE STRUCTURE FOR RADIATION RESISTANT FLASH MEMORY CELL

(75) Inventors: Fuh-cheng Jong, Tainan (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,882

(22) Filed: Aug. 27, 2002

(65) Prior Publication Data

US 2004/0041197 A1 Mar. 4, 2004

(51) Int. Cl.[7] .............................................. H01L 29/792

(52) U.S. Cl. ....................................... 257/324; 257/411

(58) Field of Search ................................ 257/202, 295, 257/298, 314, 317, 324–326, 401, E29.309; 438/216, 261, 287, 591–593; H01R 29/792

(56) References Cited

U.S. PATENT DOCUMENTS 5,559,351 A * 9/1996 Takiyama ................... 257/324
5,760,454 A * 6/1998 Nishi ......................... 257/401
2003/0011007 A1 * 1/2003 Takashino .................. 257/202

* cited by examiner

*Primary Examiner*—Long Pham
*Assistant Examiner*—Marcos D. Pizarro-Crespo
(74) *Attorney, Agent, or Firm*—Jiang Chyun IP Office

(57) ABSTRACT

A radiation resistant hexagonal gate flash memory cell. The flash memory cell includes a substrate, a source region, a drain region and a gate structure. A channel region is also formed in the substrate between the source region and the drain region. The gate structure is located above the substrate between the source region and the drain region. The gate structure further includes an oxide-nitride-oxide composite layer over the substrate. In a direction perpendicular to the channel, width of the gate structure increases gradually from the source region towards a pre-determined location and decreases towards the drain region thereafter. When the flash memory cell is subjected to radiation illumination, electron-hole pairs thus generated will be injected into the substrate without passing into the nitride layer. In a programming operation, a portion of the gate structure close to the source region serves as an equivalent source region having an area greater than the drain region so that second bit effect is greatly reduced.

4 Claims, 2 Drawing Sheets

HEXAGONAL GATE STRUCTURE FOR RADIATION RESISTANT FLASH MEMORY CELL

BACKGROUND OF INVENTION

1. Field of Invention

The present invention relates to a flash memory cell structure. More particularly, the present invention relates to a flash memory cell structure capable of resisting a high dose of radiation.

2. Description of Related Art

When a flash memory unit operates inside a radioactive environment, photons having energy in excess of 4.3 eV may be transferred to electrons so that the electrons jump an energy barrier and radiate. If the electron is located within an oxide layer, the electron may be rapidly transferred to a substrate or control gate due to the effect of an electric field. In general, electrons lost in this manner may lead to a lowering of threshold voltage for the flash memory cells.

A conventional MNOS type of memory cell provides some radiation resistance. However, the coupling constant of a MNOS memory cell is too low to meet the demands of a flash memory.

In a conventional NROM memory cell structure, size of the drain terminal and the source terminal is almost identical, or else, the drain terminal is bigger than the source terminal. This often leads to source-side injection of the memory cell and problems such as second bit effect, thereby affecting the performance of the NROM.

Thus, although a MNOS memory cell is capable of resisting radiation, a low coupling constant renders it useless as a flash memory cell. Yet, the popular NROM structure has some drawbacks including source-side injection and problems due to second bit effect. Thus, how to produce a radiation resistant NROM flash memory cell is still a major research topic.

SUMMARY OF INVENTION

Accordingly, one object of the present invention is to provide a hexagonal gate flash memory cell capable of resisting intense radiation but having a reduced source-side injection as well as second bit effect so that the memory cell has a relatively constant threshold voltage despite operating in a radioactive environment.

To achieve these and other advantages and in accordance with the purpose of the invention, as embodied and broadly described herein, the invention provides a radiation resistant hexagonal gate flash memory cell. The flash memory cell includes a substrate, a source region located within the substrate, a drain region also located within the substrate and a gate structure. The gate structure is formed over the substrate between the source region and the drain region. The gate structure further includes an oxide-nitride-oxide composite layer and a control gate layer sequentially stacked over the substrate. The gate structure has a hexagonal profile when viewed from the top. When the flash memory cell is subjected to radiation illumination, electron-hole pairs thus generated will be injected into the substrate without passing into the nitride layer.

This invention also provides a radiation resistant flash memory cell. The flash memory cell includes a substrate, a source region located within the substrate, a drain region also located within the substrate and a gate structure. A channel region is formed between the drain region and the source region. The gate structure is formed over the substrate between the source region and the drain region. The gate structure further includes an oxide-nitride-oxide composite layer and a control gate structure sequentially stacked over the substrate in a direction perpendicular to the channel region. Width of the gate structure increases from the source region to a pre-determined location. Thereafter, width of the gate structure decreases towards the drain region. When the flash memory cell is subjected to radiation illumination, electron-hole pairs thus generated will be injected into the substrate without passing into the nitride layer.

This invention also provides an alternative radiation resistant flash memory cell. The flash memory cell includes a substrate, a source region, a drain region and a gate structure. A channel region is formed between the drain region and the source region. The gate structure is formed over the substrate between the source region and the drain region. The gate structure further includes an oxide-nitride-oxide composite layer. In a direction perpendicular to the channel region, width of the gate structure increases from the source region to a pre-determined location. Thereafter, width of the gate structure decreases towards the drain region. When the flash memory cell is subjected to radiation illumination, electron-hole pairs thus generated will be injected into the substrate without passing into the nitride layer. To program codes into the flash memory cell, the section of the gate structure close to the source region serves as an equivalent source region so that size of the equivalent source region is greater than the drain region, thereby preventing second bit effect.

In the aforementioned memory cell structure, the pre-determined location may lie close to the center of symmetry of the gate structure. In addition, width of the gate structure increases from the source region along a direction perpendicular to the channel up until the pre-determined location. Thereafter, width of the gate structure decreases towards the drain region. Such an expansion and contraction of width along a direction perpendicular to the channel ultimately forms a gate having a roughly hexagonal profile.

This invention also provides a radiation resistant flash memory cell. The flash memory cell includes a substrate, a source region, a drain region and a gate structure. A channel region is formed between the drain region and the source region. The gate structure is formed over the substrate between the source region and the drain region. The gate structure further includes an oxide-nitride-oxide composite layer. In a direction perpendicular to the channel region, width of the gate structure is greater than both the drain region and the source region. In other words, the gate structure has a wide waist profile. When the flash memory cell is subjected to radiation illumination, electron-hole pairs thus generated will be injected into the substrate without passing into the nitride layer. To program codes into the flash memory cell, the section of the gate structure close to the source region serves as an equivalent source region so that size of the equivalent source region is greater than the drain region, thereby preventing second bit effect.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
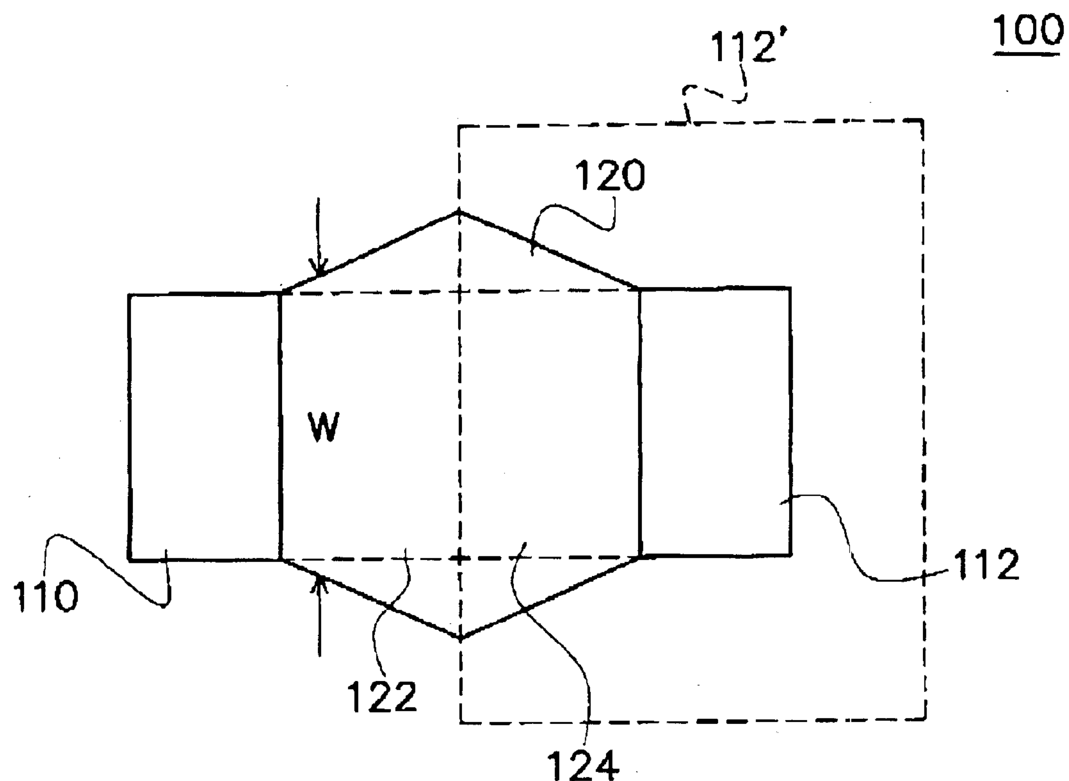
FIG. 1 is a schematic top view of a hexagonal gate flash memory cell fabricated according to this invention.

Reference will now be made in detail to the present preferred embodiments of the invention, examples of which are illustrated in the accompanying drawings. Wherever possible, the same reference numbers are used in the drawings and the description to refer to the same or like parts.

According to the results of experiments and analysis, an oxide-nitride-oxide (ONO) structure and NROM type memory cell are both capable of resisting radiation illumination. However, the coupling constant of the ONO structure is much higher than the NROM memory cell. Hence, the ONO layer of the NROM memory cell, aside from serving as an ideal trapping layer, may also serve as an excellent radiation protector.

Figure 2:
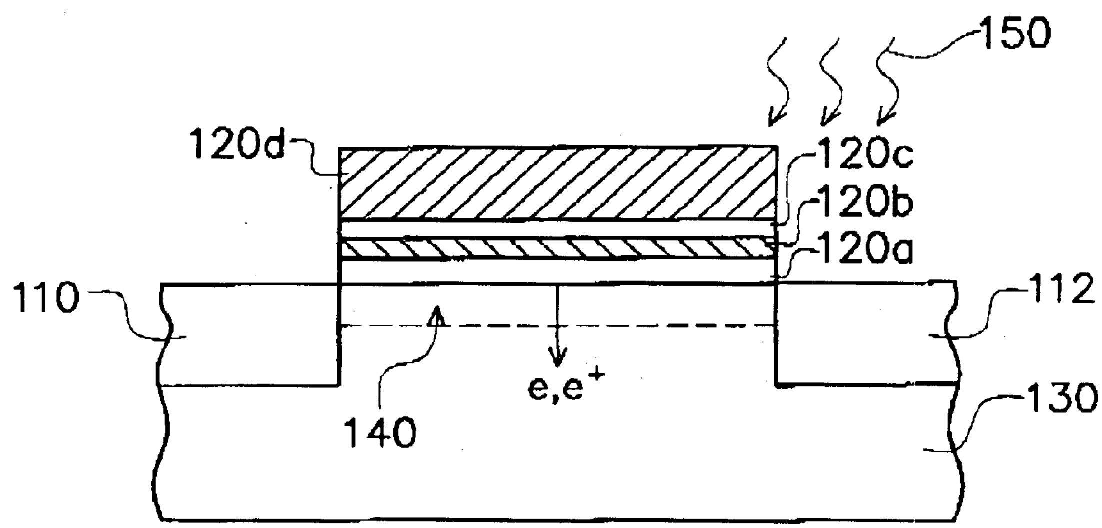
FIG. 2 is a cross-sectional view of a hexagonal gate flash memory cell fabricated according to this invention.

Referring to FIG. 1 and FIG. 2 show a schematic top view of a hexagonal gate flash memory cell fabricated and a cross-sectional view of a hexagonal gate flash memory cell fabricated respectively according to this invention. The radiation resistant hexagonal gate flash memory cell 100 includes a substrate 130, a source region 112 located within the substrate 130, a drain region 110 also located within the substrate 130 and a gate structure 120. The gate structure 120 is above the substrate 130 between the source region 112 and the drain region 110. The gate structure 120 further includes an oxide layer 120*a*, a nitride layer 120*b*, an oxide layer 120*c* and a control gate layer 120*d*. The oxide layer 120*a*, the nitride layer 120*b* and the oxide layer 120*c* together form in oxide-nitride-oxide (ONO) composite layer. The ONO layer and the control gate layer 120*d* are sequentially stacked over the substrate 130. As shown in FIG. 2, a channel region 140 is formed in the substrate 130 between the source region 112 and the drain region 110. A source region 112' as shown by the dotted line in FIG. 1 includes a portion of the gate structure 120 and the source region 112 that would be formed subsequent to programming the above gate flash memory cell.

One major aspect of this invention is in the gate structure 120 of the flash memory cell. As shown in FIG. 1, in a direction perpendicular to the channel 140, width W of the gate structure 120 increases gradually from the source region 112 to a pre-determined location. Thereafter, width of the gate structure 120 decreases gradually towards the drain region 110. Consequently, the gate structure 120 has a hexagonal profile when viewed from the top.

The energy barrier between the oxide layer 120*a* and the nitride layer 120*b* is far greater than the energy barrier between the oxide layer 120*a* and the substrate 130. Thus, the electron-hole pairs generated in the oxide layer 120 due to radiation are injected into the substrate 130 instead of the nitride layer 120*b*. Because the electron holes produced by radiation bypass the nitride layer 120*b*, trapped electrons inside the nitride layer 120*b* will not be neutralized. Hence, threshold voltage of the flash memory cell will remain at a constant value.

Figure 3:
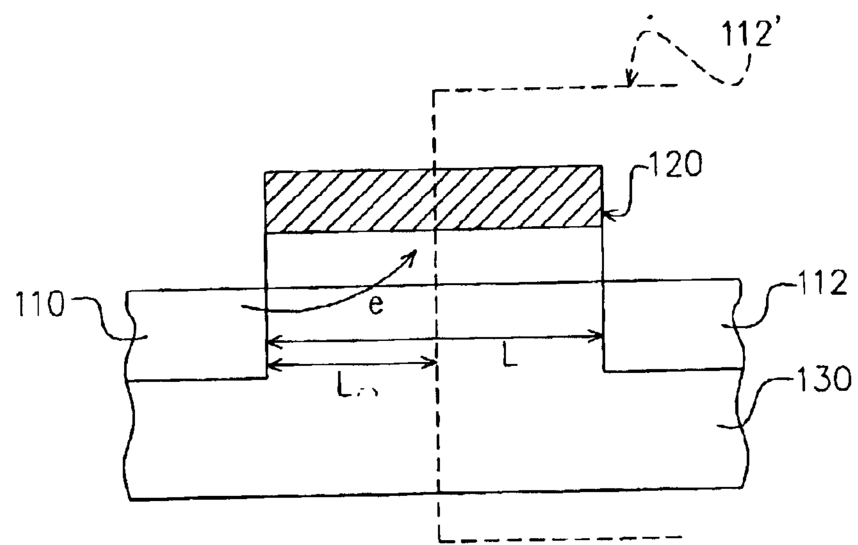
FIG. 3 is a cross-sectional view of a hexagonal gate flash memory cell fabricated according to this invention undergoing a programming operation.

FIG. 3 is a cross-sectional view of a hexagonal gate flash memory cell fabricated according to this invention undergoing a programming operation. The hexagonal structure may be regarded as two separate trapezoidal gate structures that connect to the source region 112 and the drain region 110 respectively. Thus, the hexagonal gate flash memory cell are equivalent to having two back to back gate structures 122 and 124 as shown in FIG. 1.

To program the flash memory cell, a portion of the gate structure 124 and the source region 112 can be regarded as an equivalent source region 112'. Hence, size of the drain region is much smaller than the equivalent source region 112'. During the programming operation, the equivalent channel length Leq is also much shorter than the original channel length L. Therefore, hot electrons will exit the channel somewhere along the gate structure 120 to be subsequently trapped inside the nitride layer 120*b* after passing through the oxide layer 120*a* (FIG. 3).

Since the hot electrons inject into the nitride layer halfway through the channel (the side of equivalent source region 112') rather than from the original source region 112, trajectories of the hot electrons are little affected by the original electron distribution in the source region 112. In other words, source-side injection and second bit effect are prevented using a flash memory cell with this hexagonal gate structure.

Figure 4:
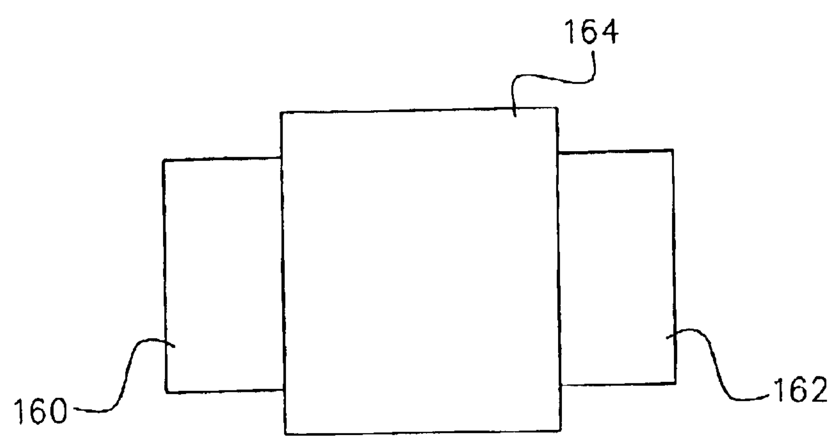
FIG. 4 is a schematic top view of a radiation resistant flash memory cell according to another embodiment of this invention.

FIG. 4 is a schematic top view of a radiation resistant flash memory cell according to another embodiment of this invention. As shown in FIG. 4, the flash memory includes a substrate, a source region 162, a drain region 160 and a gate structure 164. A channel is formed in the substrate between the drain region 160 and the source region 162. The gate structure 164 is formed over the substrate between the source region 162 and the drain region 160. The gate structure 164 has an oxidenitride-oxide composite layer. In a direction perpendicular to the channel, width of the gate structure 164 is greater than both the source region and the drain region 160. In other words, the gate structure 164 has a wide waist.

When the flash memory cell is illuminated by radiation, electron-hole pairs will inject into the substrate instead of the nitride layer. Since holes produced by the radiation are diverted from the nitride layer 120*b*, electrons originally trapped inside the nitride layer 120*b* will not be neutralized. Ultimately, threshold voltage of the flash memory cell will remain constant. Furthermore, in a program coding operation, a portion of the gate structure 164 close to the source region 162 may serve as an equivalent source region. Since the equivalent source region has a size much greater than the drain region, second bit effect is reduced considerably.

In summary, this invention utilizes the radiation resistant ONO layer inside a NROM memory cell together with a hexagonal or wide waist gate structure to prevent second bit effect and source-side injection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An NROM memory cell structure formed on a substrate, the cell structure comprising:

one source and one drain regions formed inside the substrate;

one gate structure formed on the substrate between the source region and the drain region, the gate structure including an oxide-nitride-oxide layer and a control gate layer sequentially stacked on the substrate, wherein said gate structure has a waist portion wider than two ends thereof respectively adjacent to the source region and the drain region and wherein a source-side electron injection is minimized when a programming action is proceeded.

2. The NROM memory cell structure of claim 1, wherein the waist portion is roughly at a symmetrical line that runs across the central region of the gate structure between the source and the drain regions.

3. The NROM memory cell structure of claim 1, wherein in a programming operation, a portion of the gate structure close to the source region serves as an equivalent source region such that an overall size of the equivalent source region is greater than the drain region so as to prevent a second bit effect.

4. The NROM memory cell structure of claim 1, wherein the gate structure is roughly a hexagonal shape with two sides being adjacent to the source and the drain regions.

* * * * *